(12) United States Patent
Sanchis

(10) Patent No.: US 10,890,601 B2
(45) Date of Patent: Jan. 12, 2021

(54) ELECTRICAL EQUIPMENT FOR CONNECTION TO A TACHOMETER FOR MEASURING A SPEED OF ROTATION OF A WHEEL OF AN AIRCRAFT LANDING GEAR

(71) Applicant: SAFRAN LANDING SYSTEMS, Velizy Villacoublay (FR)

(72) Inventor: Ghislain Sanchis, Velizy Villacoublay (FR)

(73) Assignee: SAFRAN LANDING SYSTEMS, Velizy Villacoublay (FR)

( * ) Notice: Subject to any disclaimer, the term of this patent is extended or adjusted under 35 U.S.C. 154(b) by 262 days.

(21) Appl. No.: 16/000,996

(22) Filed: Jun. 6, 2018

(65) Prior Publication Data

US 2018/0356442 A1  Dec. 13, 2018

(30) Foreign Application Priority Data

Jun. 7, 2017 (FR) .................................. 17 55062

(51) Int. Cl.
*G01R 31/02* (2006.01)
*G01P 21/02* (2006.01)
(Continued)

(52) U.S. Cl.
CPC .............. *G01P 21/02* (2013.01); *B60T 8/885* (2013.01); *G01P 3/487* (2013.01); *G01P 3/60* (2013.01);
(Continued)

(58) Field of Classification Search
CPC .... G01P 3/44; G01P 3/60; G01P 3/487; G01P 3/4807; G01P 21/00; G01P 21/02;
(Continued)

(56) References Cited

U.S. PATENT DOCUMENTS 4,092,853 A   6/1978 Schneider et al.
4,265,337 A * 5/1981 Dammeyer ........... B66F 17/003
                                          180/170
(Continued)

FOREIGN PATENT DOCUMENTS

| EP | 0 764 829 A1 | 3/1997 |
| FR | 2 328 967 A1 | 5/1977 |
| FR | 2 621 166 A1 | 3/1989 |
| FR | 2 701 176 A1 | 8/1994 |
| FR | 3 023 071 A1 | 1/2016 |

(Continued)

OTHER PUBLICATIONS

French Preliminary Search Report for 17 55062 dated Feb. 15, 2018.
French Written Opinion for 17 55062 dated Feb. 15, 2018.

*Primary Examiner* — Minh N Tang
(74) *Attorney, Agent, or Firm* — Sughrue Mion, PLLC

(57) ABSTRACT

An electrical equipment includes a calculator or a data concentrator for connecting to a tachometer via a cable that includes a measurement wire and a test wire. The electrical equipment has a measurement input to which the measurement wire can be connected and a test input to which the test wire can be connected, measurement acquisition components connected to the measurement input and arranged to acquire an electrical measurement signal present on the measurement wire and produced by the tachometer, test acquisition components connected to the test input and arranged to detect whether the test wire is or is not open-circuit, and processor components arranged to detect a break of the measurement wire if the test wire is open-circuit.

11 Claims, 3 Drawing Sheets

(51) Int. Cl.
  *G01R 31/50*    (2020.01)
  *B60T 8/88*     (2006.01)
  *G01P 3/487*    (2006.01)
  *G01P 3/60*     (2006.01)
  *G01P 21/00*        (2006.01)
  *G01R 31/00*        (2006.01)

(52) U.S. Cl.
  CPC ........ *G01R 31/50* (2020.01); *B60T 2270/416* (2013.01); *G01P 21/00* (2013.01); *G01R 31/008* (2013.01)

(58) Field of Classification Search
  CPC ......... B60T 8/88; B60T 8/885; G01R 31/008; G01R 31/50; G01R 31/52; G01R 31/54
  See application file for complete search history.

(56) References Cited

U.S. PATENT DOCUMENTS

| | | | |
|---|---|---|---|
| 4,805,447 A | | 2/1989 | Meguro et al. |
| 5,422,568 A | | 6/1995 | Hashizume et al. |
| 5,483,817 A | * | 1/1996 | Renard .................. G01P 21/02 73/1.82 |
| 2004/0189323 A1 | | 9/2004 | Nagase |
| 2016/0003885 A1 | | 1/2016 | Loke et al. |

FOREIGN PATENT DOCUMENTS

| | | |
|---|---|---|
| JP | 58-113767 A | 7/1983 |
| WO | 2015/036445 A1 | 3/2015 |
| WO | 2016/146918 A1 | 9/2016 |

\* cited by examiner

ELECTRICAL EQUIPMENT FOR CONNECTION TO A TACHOMETER FOR MEASURING A SPEED OF ROTATION OF A WHEEL OF AN AIRCRAFT LANDING GEAR

The invention relates to the field of electrical equipment of the type comprising calculation means or a data concentrator and that is for connecting to tachometers.

BACKGROUND OF THE INVENTION

A tachometer for measuring a speed of rotation of a wheel of aircraft landing gear conventionally comprises a rotor constrained to rotate with the wheel, a stator, and a speed-of-rotation sensor. The speed-of-rotation sensor comprises a coil positioned on the stator.

The coil is connected via a cable to calculation means (or any other electrical equipment, e.g. a data concentrator). The calculation means thus acquire an electrical measurement signal having a voltage and/or a frequency representative of the speed of rotation of the wheel.

Generally, a plurality of cables coming from a plurality of tachometers are grouped together in a harness that runs from the landing gear into the inside of the fuselage of the aircraft where the calculation means are located.

Unfortunately, it can happen that one of the tires of a wheel in the landing gear bursts. Tire debris is then projected and can damage the harness and sever one of the cables.

It is then appropriate to detect that the tachometer connected to the severed cable has been lost. It should be observed that a zero voltage for the electrical measurement signal could correspond to a zero speed of rotation and thus to a measurement of a speed of rotation that is "normal" and correctly measured.

It should also be observed that it is possible for one of the wheels, while skidding or locked, to present a speed of rotation that is zero even though the speed of rotation of the other wheels is not zero.

Merely detecting a zero voltage, even when compared with speeds of rotation from the other wheels, therefore does not suffice for detecting a severed cable.

Proposals have been made to make the speed-of-rotation sensor redundant in each tachometer. Such redundancy requires doubling the number of inputs to the calculation means for measuring the speeds of rotation of the wheels, and adds additional weight and bulk in association with each tachometer. Such redundancy also implies making use of two cables between the tachometer and the calculation means, instead of only one.

Proposals have also been made for only the cable connecting the tachometer to the calculation means to be provided in redundant manner. Such redundancy still adds additional weight, and also creates loops in the electric circuit formed by the cables and the calculation means, which is problematic for complying with requirements concerning electromagnetic compatibility.

It should be observed that in both of the above-described proposals, the loss of two cables connecting the tachometer to the calculation means is not detected.

Finally, proposals have been made to test the continuity of the cable and of the coil regularly by injecting a small signal into the cable and into the coil. Nevertheless, that implies that acquisition of the electrical measurement signal, and thus of the speed of rotation of the wheel, needs to be deactivated regularly, which is not acceptable in a braking system that implements an anti-skid or "anti-block" braking function.

OBJECT OF THE INVENTION

An object of the invention is to detect a break in a cable connecting a tachometer to a piece of electrical equipment in a manner that is simple, compact, and without deactivating the measurement of the speed of rotation of the wheel.

SUMMARY OF THE INVENTION

In order to achieve this object, there is provided electrical equipment of the type comprising calculation means of a data concentrator for connecting to a tachometer via a cable that comprises a measurement wire and a test wire, the electrical equipment having a measurement input to which the measurement wire can be connected and a test input to which the test wire can be connected, measurement acquisition components connected to the measurement input and arranged to acquire an electrical measurement signal present on the measurement wire and produced by the tachometer, test acquisition components connected to the test input and arranged to detect whether the test wire is or is not open-circuit, and processor components arranged to detect a break of the measurement wire if the test wire is open-circuit.

A break in the measurement wire is thus detected by detecting that the test wire is open-circuit. This solution is simple to implement and compact, since it requires no more than adding the test wire to the cable that also includes the measurement wire connected to the tachometer. This solution does not require deactivating acquisition of the electrical measurement signal, since the test wire, which enables a break in the measurement wire to be detected, is distinct from the measurement wire.

Furthermore, the invention provides a system comprising a tachometer, a cable including a measurement wire and a test wire, and electrical equipment as described above, the cable having a first end connected to the tachometer and a second end connected to the electrical equipment.

The invention can be better understood in the light of the following description of particular, non-limiting embodiments of the invention.

BRIEF DESCRIPTION OF THE DRAWINGS

Reference is made to the accompanying drawings, in which.

DETAILED DESCRIPTION OF THE INVENTION

Figure 1:
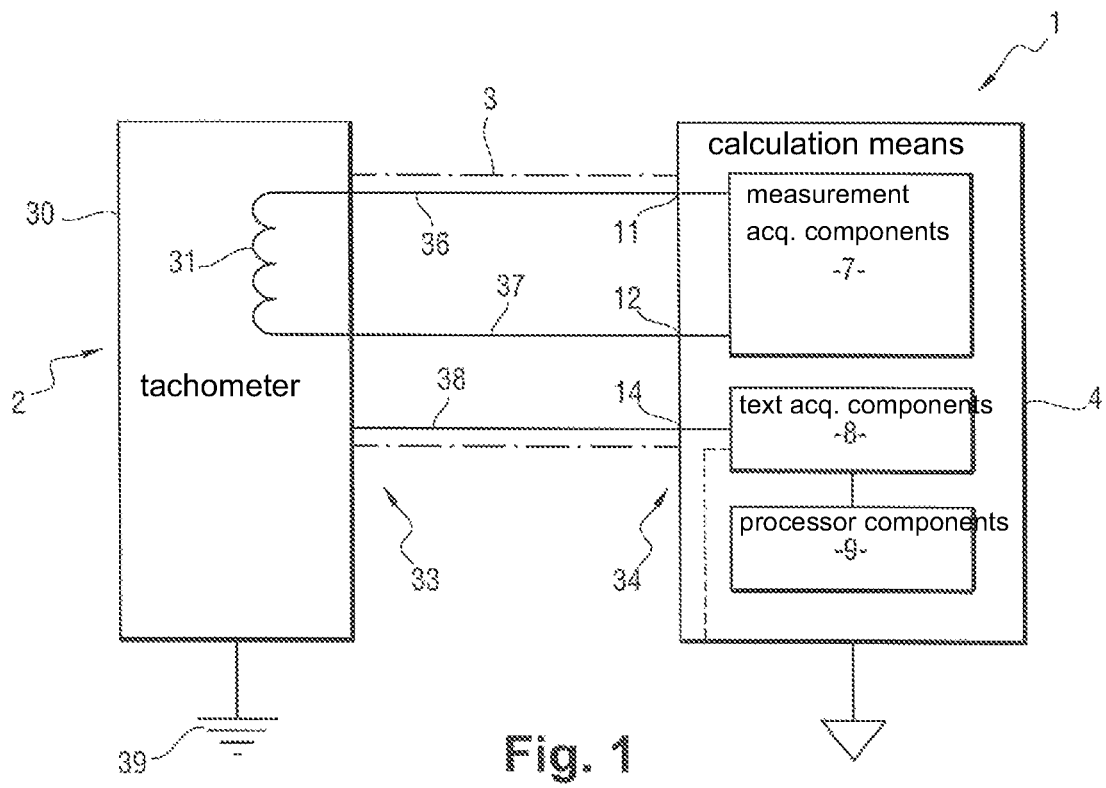
FIG. 1 shows electrical equipment in a first embodiment of the invention, together with a cable and a tachometer.

With reference to FIG. 1, the electrical equipment in a first embodiment of the invention comprises calculation means 1 in this example. The calculation means 1 are connected to a tachometer 2 by a cable 3.

The calculation means 1 are situated in a hold of an aircraft.

The calculation means 1 comprise a casing 4 containing measurement acquisition components 7, test acquisition components 8, and processor components 9.

The calculation means 1 comprises a first measurement input 11 and a second measurement input 12. The first measurement input 11 and the second measurement input 12 are connected to the measurement acquisition components 7.

The calculation means 1 also include a test input 14. The test input 14 is a discrete input. The test input 14 is connected to the test acquisition components 8.

Figure 2:
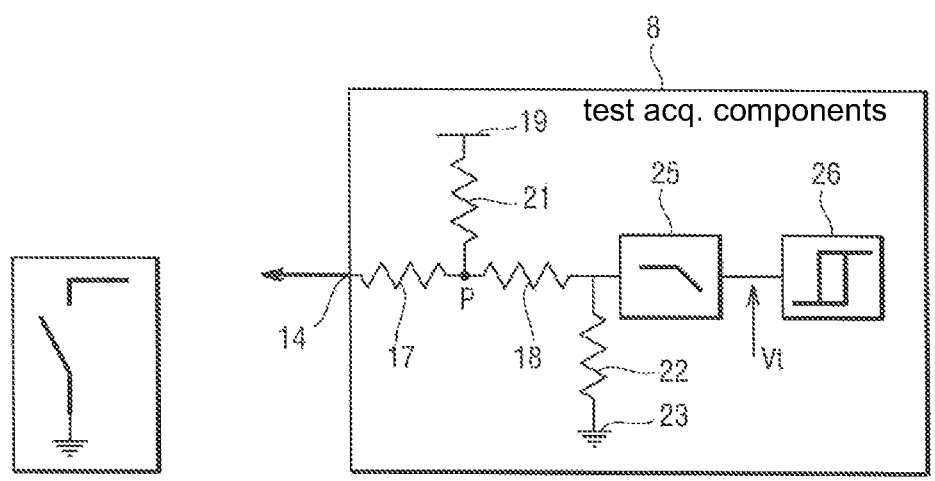
FIG. 2 shows test acquisition components of the electrical equipment in the first embodiment of the invention.

The test acquisition components 8 can be seen in FIG. 2. In this example, the test acquisition components 8 are components for acquiring a discrete signal.

The test acquisition components 8 comprise resistors 17 and 18 connected to the test input 14, a reference voltage source 19 connected via a resistor 21 to a point P situated between the resistors 17 and 18, and a resistor 22 connected between the resistor 18 and electrical ground 23 of the calculation means 1. The test acquisition component 8 also includes a lowpass filter 25 and a hysteresis comparator 26. An input of the lowpass filter 25 is connected to the resistor 18 and to the resistor 22. An output of the lowpass filter 25 is connected to an input of the hysteresis comparator 26.

The electrical ground 23 is connected to the casing 4 of the calculation means 1.

The tachometer 2 is for measuring the speed of rotation of an aircraft landing-gear wheel. The tachometer 2 comprises a casing 30 incorporating a speed-of-rotation sensor. The speed-of-rotation sensor comprises a rotor and a stator that includes a winding 31.

In this example, part of the length of the cable 3 is located in a harness that groups together a plurality of similar cables connected to tachometers. The harness runs from the landing gear to the hold of the aircraft.

The cable 3 has a first end 33 and a second end 34. The first end 33 is connected to the tachometer 2. The second end 34 is connected to the calculation means 1.

The cable 3 has a first measurement wire 36, a second measurement wire 37, and a test wire 38. The first measurement wire 36, the second measurement wire 37, and the test wire 38 are twisted together, i.e. they are wound helically about one another.

At the first end 33 of the cable 3, the first measurement wire 36 is connected to a first terminal of the stator winding 31. The second measurement wire 37 is connected to a second terminal of the stator winding 31. The test wire 38 is connected to ground 39 of the tachometer 2 via shielding of the harness or of the cable 3, or indeed via a mechanical body of the tachometer 2 if the casing 30 of the tachometer 2 is referenced to ground.

At the second end 34 of the cable 3, the first measurement wire 36 is connected to the first measurement input 11 of the calculation means 1, the second measurement wire 37 is connected to the second measurement input 12, and the test wire 38 is connected to the test input 14.

The measurement acquisition components 7 of the calculation means 1 acquire an electrical measurement signal of voltage and/or frequency representative of the speed of rotation of the wheel.

The test acquisition components 8 compare a test voltage Vt at the input to the hysteresis comparator 26 with a detection threshold, specifically a predetermined voltage threshold. The test voltage Vt is representative of the impedance connected to the test input 14.

If the test voltage Vt is below the predetermined voltage threshold, the test acquisition components 8 detect that a discrete ground signal is being applied of the test input 14. The ground signal corresponds to the test wire 38 being connected to the ground 39 of the tachometer 2 at the first end 33 of the cable 3.

The processor components 9 then detect continuity of the test wire 38, and thus that the test wire 38 has not been broken. The processor components 9 therefore do not detect a break in the first measurement wire 36 or in the second measurement wire 38. Specifically, because of the proximity between the test wire 38 and the first and second measurement wires 36 and 37, a break in the test wire 38, e.g. due to a tire bursting, will very probably be accompanied by a break in the first measurement wire 36 or in the second measurement wire 37.

If the test voltage Vt is greater than or equal to the predetermined voltage threshold, the test acquisition components 8 detect that a discrete open-circuit signal is being applied to the test input 14. The open circuit corresponds to the test wire 38 being open-circuit.

The processor components 9 then detect a break in the test wire 38, and thus a break in the first measurement wire 36 and/or in the second measurement wire 37. The processor components 9 then invalidate speed-of-rotation measurement from the electrical measurement signal, deactivating the tachometer 2, and generating a fault message.

Figure 3:
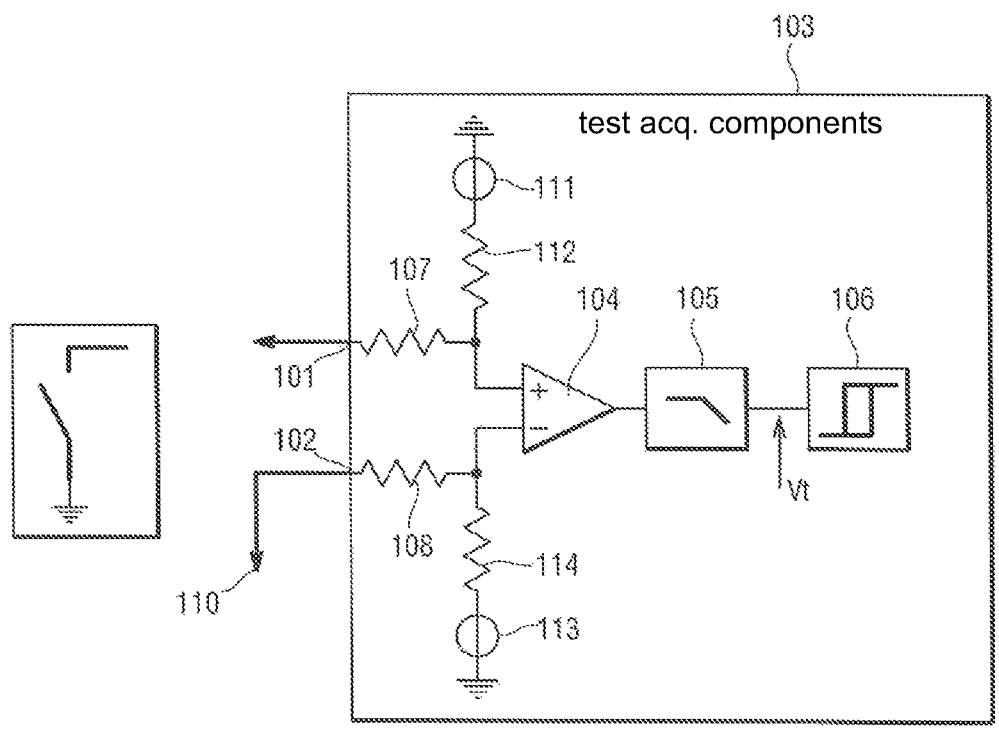
FIG. 3 shows test acquisition components of electrical equipment in a second embodiment of the invention.

With reference to FIG. 3, the electrical equipment in a second embodiment of the invention is once more constituted by calculation means. The calculation means are connected to a tachometer by a cable. The tachometer and the cable are similar to those described above.

The calculation means in this example have a first test input 101 and a second test input 102. The first test input 101 and the second test input 102 are both discrete inputs. The calculation means has test acquisition components 103. Once more, the test acquisition components 103 are components for acquiring a discrete signal.

The test acquisition components 103 comprise an operational amplifier 104, a lowpass filter 105, and a hysteresis comparator 106.

A non-inverting input of the operational amplifier 104 is connected to the first test input 101 via a resistor 107. An inverting input of the operational amplifier 104 is connected to the second test input 102 via a resistor 108.

The test wire is connected to the first test input 101.

The second test input 102 is connected to electrical ground 110 of the calculation means, e.g. via the casing of the calculation means or via the shielding of the harness or of the cable.

A first reference current source 111 is connected to the non-inverting input via a resistor 112. A second reference current source 113 is connected to the inverting input via a resistor 114.

An output from the operational amplifier 104 is connected to an input of the lowpass filter 105. An output of the lowpass filter 105 is connected to an input of the hysteresis comparator 106.

Once more, the test acquisition components 103 compare a test voltage Vt input to the hysteresis comparator 106 with a predetermined voltage threshold. The test voltage Vt is representative of the impedance applied between the first test input 101 and the second test input 102.

If the test voltage Vt is less than the predetermined voltage threshold, the test acquisition components 103 detect that a discrete ground signal is being applied to the first test input 101.

The processor components then detect continuity of the test wire, and thus that the test wire has not been broken. The processor components therefore do not detect a break in the first measurement wire or in the second measurement wire.

If the test voltage Vt is greater than the predetermined voltage threshold, the test acquisition components 103 detect that an open-circuit discrete signal is being applied to the first test input 101.

The processor components then detect a break in the test wire, and thus a break in the first measurement wire and/or in the second measurement wire. The processor components invalidate speed-of-rotation measurements from the electrical measurement signal, deactivating the tachometer and generating a fault message.

Figure 4:
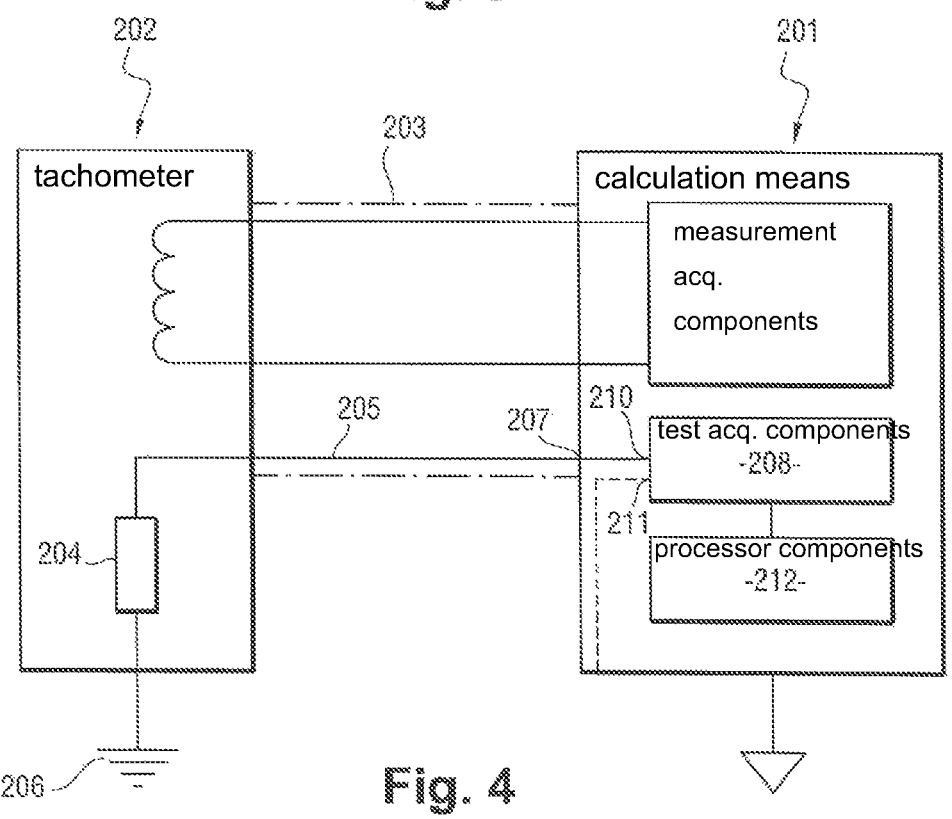
FIG. 4 shows electrical equipment in a third embodiment of the invention, together with a cable and a tachometer.

With reference to FIG. 4, the electrical equipment in a third embodiment of the invention comprises calculation means 201. The calculation means 201 are connected to a tachometer 202 via a cable 203.

The tachometer 202 includes an electric circuit having a resistor 204 connected therein. The test wire 205 is connected to ground 206 of the tachometer 202 via the resistor 204.

The calculation means 201 include a test input 207 connected to the test wire 205. In this example, the test acquisition components 208 are components for measuring resistance.

The test acquisition components 208 include a first input 210 connected to the test input 207 of the calculation means 201, and a second input 211 connected to electrical ground of the calculation means 201.

The test acquisition components 208 measure a test resistance between the first input 210 and the second input 211, and thus between the test input 207 and electrical ground of the calculation means 201.

If the test resistance is less than a predetermined resistance threshold, the test acquisition components 208 do not detect that the test wire 205 is open-circuit. The processor components 212 detect that the test wire 205 is not broken.

If the test resistance is greater than or equal to a predetermined resistance threshold, then the test acquisition components 208 detect that the test wire 205 is open-circuit.

The processor components 212 thus detect that the test wire 205 is broken and thus that the first measurement wire and/or the second measurement wire is broken. The processor components 212 invalidate speed-of-rotation measurements from the electrical measurement signal, deactivating the tachometer and generating a fault message.

Figure 5:
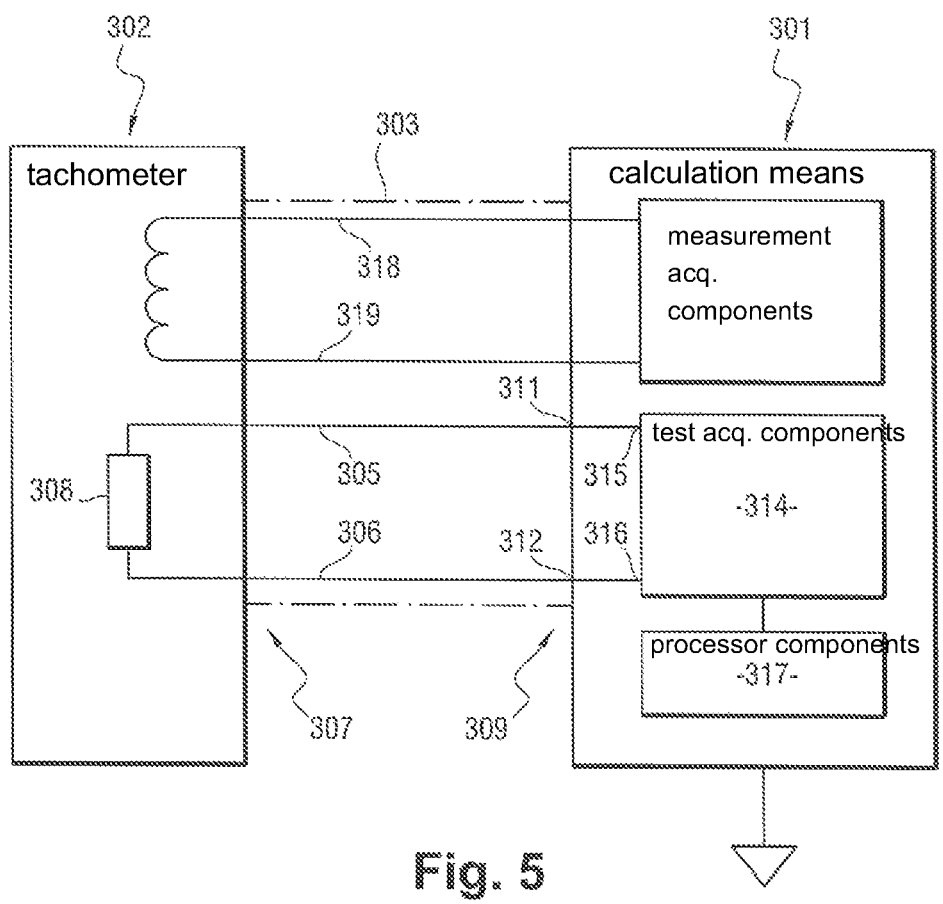
FIG. 5 shows electrical equipment in a fourth embodiment of the invention, together with a cable and a tachometer.

With reference to FIG. 5, the electrical equipment in a fourth embodiment of the invention comprises calculation means 301. The calculation means 301 are connected to a tachometer 302 via a cable 303.

In the fourth embodiment of the invention, the cable 303 has a first test wire 305 and a second test wire 306.

At a first end 307 of the cable 303, the first test wire 305 is connected to a first terminal of a resistor 308 in the tachometer 302. At the first end 307 of the cable 303, the second test wire 306 is connected to a second terminal of the resistor 308.

At a second end 309 of the cable 303, the first test wire 305 is connected to a first test input 311 of the calculation means 301. At the end second end 309 of the cable 303, the second test wire 306 is connected to a second test input 312 of the calculation means 301.

The test acquisition components 314 include a first input 315 connected to the first test input 311 of the calculation means 301, and a second input 316 connected to the second test input 312 of the calculation means 301.

Once more, the test acquisition components 314 are components for measuring resistance.

The test acquisition components 314 measure a test resistance between the first input 315 and the second input 316, and thus between the first test input 311 and the second test input 312 of the calculation means 301.

If the test resistance lies within a valid range of resistance values, then the processor components 317 detect that the first test wire 305 and the second test wire 306 are not broken.

If the test resistance does not lie in the valid range of resistance values, then the processor components 317 detect that the first test wire 305 and/or the second test wire 306 is/are broken.

The processor components 317 then detect a break in the first measurement wire 318 and/or the second measurement wire 319. The processor components 317 invalidate speed-of-rotation measurements from the electrical measurement signal, deactivating the tachometer and generating a fault message.

Naturally, the present invention is not limited to the embodiments described but covers any variant coming within the field of the invention as defined by the claims.

Although the electrical equipment described above comprises calculation means, the electrical equipment could be different, e.g. a data concentrator.

The invention claimed is:

1. An electrical equipment comprising:

a measurement input arranged to be connected to a measurement wire of a cable for connecting to a tachometer;

a test input arranged to be connected to a test wire of the cable;

measurement acquisition components connected to the measurement input and arranged to acquire an electrical measurement signal present on the measurement wire and produced by the tachometer;

test acquisition components connected to the test input and arranged to detect whether the test wire is or is not open-circuit; and processor components arranged to detect a break of the measurement wire if the test wire is open-circuit.

2. The electrical equipment according to claim 1, wherein the test input is a discrete input, and wherein the test acquisition components are arranged to detect a discrete open-circuit signal or a discrete ground signal.

3. The electrical equipment according to claim 2, the electrical equipment including a first test input and a second test input, the first test input being for connecting to the test wire and the second test input being connected to an electrical ground of the electrical equipment.

4. The electrical equipment according to claim 1, wherein the test acquisition components are arranged to measure a test resistance.

5. The electrical equipment according to claim 4, wherein the test resistance is a resistance between the test input and an electrical ground of the electrical equipment.

6. The electrical equipment according to claim 4, wherein the electrical equipment includes a first test input and a second test input, the test resistance being a resistance between the first test input and the second test input.

7. A system comprising:
a tachometer;
a cable including a measurement wire and a test wire; and
an electrical equipment comprising:
- a measurement input connected to the measurement wire of the cable;
- a test input connected to a test wire of the cable;
- measurement acquisition components connected to the measurement input and arranged to acquire an electrical measurement signal present on the measurement wire and produced by the tachometer;
- test acquisition components connected to the test input and arranged to detect whether the test wire is or is not open-circuit; and
- processor components arranged to detect a break of the measurement wire if the test wire is open-circuit, wherein the cable has a first end connected to the tachometer and a second end connected to the electrical equipment.

8. The system according to claim 7, wherein the measurement wire and the test wire are twisted together.

9. The system according to claim 7, wherein the test wire is connected to tachometer ground at the first end of the cable.

10. The system according to claim 7, wherein the tachometer includes an electric circuit having a resistor connected therein, and wherein the test wire is connected to tachometer ground via the resistor.

11. The system according to claim 7, wherein the cable has two test wires, wherein the tachometer has an electrical circuit having a resistor connected therein, and wherein each test wire is connected to a distinct terminal of the resistor.

* * * * *